United States Patent [19]

Dodt et al.

[11] Patent Number: 5,369,641
[45] Date of Patent: Nov. 29, 1994

[54] METHOD AND APPARATUS FOR DETECTING AND CORRECTING ERRORS IN DATA ON MAGNETIC TAPE MEDIA

[75] Inventors: William C. Dodt, Broomfield; Thomas G. Liehe, Denver; Donald F. McCarthy, Westminster; Charles A. Milligan, Golden, all of Colo.

[73] Assignee: Storage Technology Corporation, Louisville, Colo.

[21] Appl. No.: 791,793

[22] Filed: Nov. 12, 1991

[51] Int. Cl.⁵ ............................................. G06F 11/00
[52] U.S. Cl. ..................................... 371/2.2; 371/37.4
[58] Field of Search ................. 371/2.1, 2.2, 40.1, 371/37.4

[56] References Cited

U.S. PATENT DOCUMENTS

| | | | |
|---|---|---|---|
| 3,868,632 | 2/1975 | Hong | 371/37.4 |
| 4,447,902 | 5/1984 | Wilkinson | 371/37.4 |
| 4,495,623 | 1/1985 | George | 371/37.4 |
| 4,534,031 | 8/1985 | Jewer | 371/40.1 |
| 4,564,945 | 1/1986 | Glover | 371/38 |
| 4,769,819 | 9/1988 | Matsutani | 371/37.4 |
| 4,881,232 | 11/1989 | Sako | 371/37.4 |
| 4,882,732 | 11/1989 | Kaminaga | 371/40.1 X |
| 4,908,826 | 3/1990 | Hertrich | 371/40.1 |
| 5,107,505 | 4/1992 | Lelandais | 371/37.4 |

FOREIGN PATENT DOCUMENTS

| | | | |
|---|---|---|---|
| 0129324 | 5/1984 | European Pat. Off. | G11B 7/00 |
| 0267029 | 4/1987 | European Pat. Off. | G11B 20/18 |
| 9107721 | 5/1991 | WIPO | G06F 11/10 |

OTHER PUBLICATIONS

Patent Abstracts of Japan, vol. 12, No. 259 (p. 733), Jul. 21, 1988.

Primary Examiner—Robert W. Beausoliel, Jr.
Assistant Examiner—Glenn Snyder
Attorney, Agent, or Firm—Duft, Graziano & Forest

[57] ABSTRACT

The control software and hardware in the tape drive control unit creates and manages a multiple level error detection and correction system to protect the data written on the magnetic tape. The helical scan data write circuits operate on the received stream of data records to produce two orthogonal error detection and correction codes on a scan group level. The data write circuit divides the received stream of data records into data segments, each of which contains a predetermined number of data bytes. A first of these scan group error codes is generated on a per data segment basis while a second scan group error is generated across multiple data segments. A third level error correction code is also used to protect an entire scan group rather than data on a per byte basis. The third level error correction code generator produces an error code over a predetermined number of sequentially written scan groups to enable the control unit to reconstruct an entire scan group if its data integrity is compromised.

28 Claims, 12 Drawing Sheets

FIG.17.

METHOD AND APPARATUS FOR DETECTING AND CORRECTING ERRORS IN DATA ON MAGNETIC TAPE MEDIA

CROSS REFERENCE TO RELATED APPLICATIONS

This application is related to U.S. patent application Ser. No. 07/741489 "Method and Apparatus for Administering Data on Magnetic Tape Media" filed Nov. 12, 1991, U.S. patent application Ser. No. 07/791791 titled "Method and Apparatus for Writing Data on Magnetic Tape Media" filed Nov. 12, 1991, U.S. patent application Ser. No. 07/791486 titled "Method for Utilizing a Longitudinal Track on a Helical Scan Tape Data Storage System to Provide a Fast Search Capability" filed Nov. 12, 1991.

FIELD OF THE INVENTION

This invention relates to magnetic data storage media and, in particular, to a method and apparatus for detecting and correcting errors in the data that is written on a magnetic tape media.

PROBLEM

It is a problem in the field of data storage systems to maximize the data storage capacity of the data storage media while minimizing both the cost of the media and the data retrieval time. Magnetic tape has become the industry standard data storage media for the storage and retrieval of large amounts of data, where the media cost must be kept to a minimum and the data retrieval time is not a critical factor. The data storage capacity and media cost of magnetic tape have been reduced by the use of helical scan data recording techniques on magnetic tape media.

Helical scan tape drive systems make use of the 3480-type magnetic tape cartridge which contains a single reel of half inch magnetic tape. The 3480-type magnetic tape cartridge is an industry standard media form factor used in the data processing industry for longitudinal recording of data on magnetic tape. The selection of this form factor is desirable due to the fact that automated library systems, such as the 4400 Automated Cartridge System (ACS) manufactured by Storage Technology Corporation of Louisville, Colo., are presently used to robotically store and retrieve a large number of 3480-type magnetic tape cartridges for an associated plurality of tape drives. The helical scan data recording format enables the user to store significantly more data on a 3480-type magnetic tape form factor cartridge than is presently available with longitudinal recording on magnetic tape.

A significant problem with all magnetic tape media is that the media can contain defects that cause errors in the data written thereon. The greater the data density on the media, the more data errors are caused by a media defect. Therefore, the error detection and correction systems used on the media must be robust enough to safeguard the data from media defects.

The helical scan data format read/write apparatus segments the received stream of data records into tracks that are written on to the magnetic tape in a pattern called scan groups. Existing helical scan error detection and correction systems are designed to handle individual byte errors on a single track in a single scan group. Media defects that impact the magnetic tape on a multiple track basis cause unrecoverable errors. There presently exists no system to safeguard the magnetic tape from media defects of significant extent.

SOLUTION

The above described problems are solved and a technical advance achieved in the field by the method and apparatus of the present invention for detecting and correcting errors in data on a magnetic tape media to safeguard the data written on the magnetic tape from media defects of significant extent. This is accomplished by the use of control software and hardware in the tape drive control unit that creates and manages a multiple level error detection and correction system to protect the data written on the magnetic tape.

In operation, whenever the 3480-type magnetic tape cartridge is mounted on a tape drive and the magnetic tape contained therein threaded through the tape threading path onto the tape drive takeup reel, the tape drive control unit accesses the header segment of the magnetic tape to read the administrative data written thereon. If the host computer has requested a write data record operation, the tape drive control unit scans the header segment to locate the entry that identifies the physical location on the magnetic tape of the end of the last written data record. Once this directory entry has been located, the control unit can retrieve the information contained within this directory entry and use this physical positioning information to quickly and precisely position the end of the last written data record under the read/write heads of the tape drive to enable the tape drive to write the next successive data record at the physical end of the last previously written data record.

The helical scan data write circuits operate on the received stream of data records to produce two orthogonal error detection and correction codes on a scan group level. The data write circuit divides the received stream of data records into data segments, each of which contain a predetermined number of data bytes. A first of these scan group error codes is generated on a per data segment basis while a second scan group error code is generated across multiple data segments. Both of these error codes protect the data written in a single scan group. A third level error correcting code is also used to protect an entire scan group rather than data on a per byte basis. The third level error correction code generator produces an error code over a predetermined number of sequentially written scan groups to enable the control unit to reconstruct an entire scan group if its data integrity is compromised. The third level error correction code typically consists of a parity calculation over n scan groups and produces a third level ECC scan group which is written on to the magnetic tape immediately following the last scan group included in the parity calculation. The third level ECC scan group enables the control unit to reconstruct a scan group by simply Exclusive-ORing the n−1 remaining scan groups with the ECC scan group. This system quickly and efficiently provides protection of the data from media defects of significant extent.

The multiple, nested error codes thereby enable the control unit to detect and correct errors from an individual byte basis to an entire scan group basis. These error codes are all orthogonal to each other and of varying extent. The control unit can therefore escalate the error detection and correction operation, as a function of the extent of the errors, using error correction codes that operate on a single data segment a pair of tracks or an entire scan group.

A section of the header segment also includes administrative information relating to the read/write history of the data records, error logs to note the physical integrity of the magnetic tape, identification of the manufacturer of the magnetic tape, write protect status of the magnetic tape, magnetic tape volume serial number, any additional information relating to the administration of the data records stored on the magnetic tape. This administrative data enables the control unit and the host processor to identify a magnetic tape that is subject to an unacceptable level of errors on the media. Such a magnetic tape can then be retired and the data contained thereon rewritten to a new tape before the integrity of this data is comprised. In addition, the error logs contain data that can be used to detect tape drive failures since a record of the errors and corresponding tape drives is maintained in the header.

Therefore, the method and apparatus of the present invention safeguards the data written on the magnetic tape from media defects of significant extent by enabling the control unit to use the plurality of error codes during a data record read operation to detect and correct errors contained within the data written on the magnetic tape.

BRIEF DESCRIPTION OF THE DRAWING

FIGS. 14-20 illustrate various data formats;

FIG. 21 illustrates in block diagram form the third level error correcting code generation apparatus; and.

DETAILED DESCRIPTION

Tape Drive System Architecture

Figure 3:
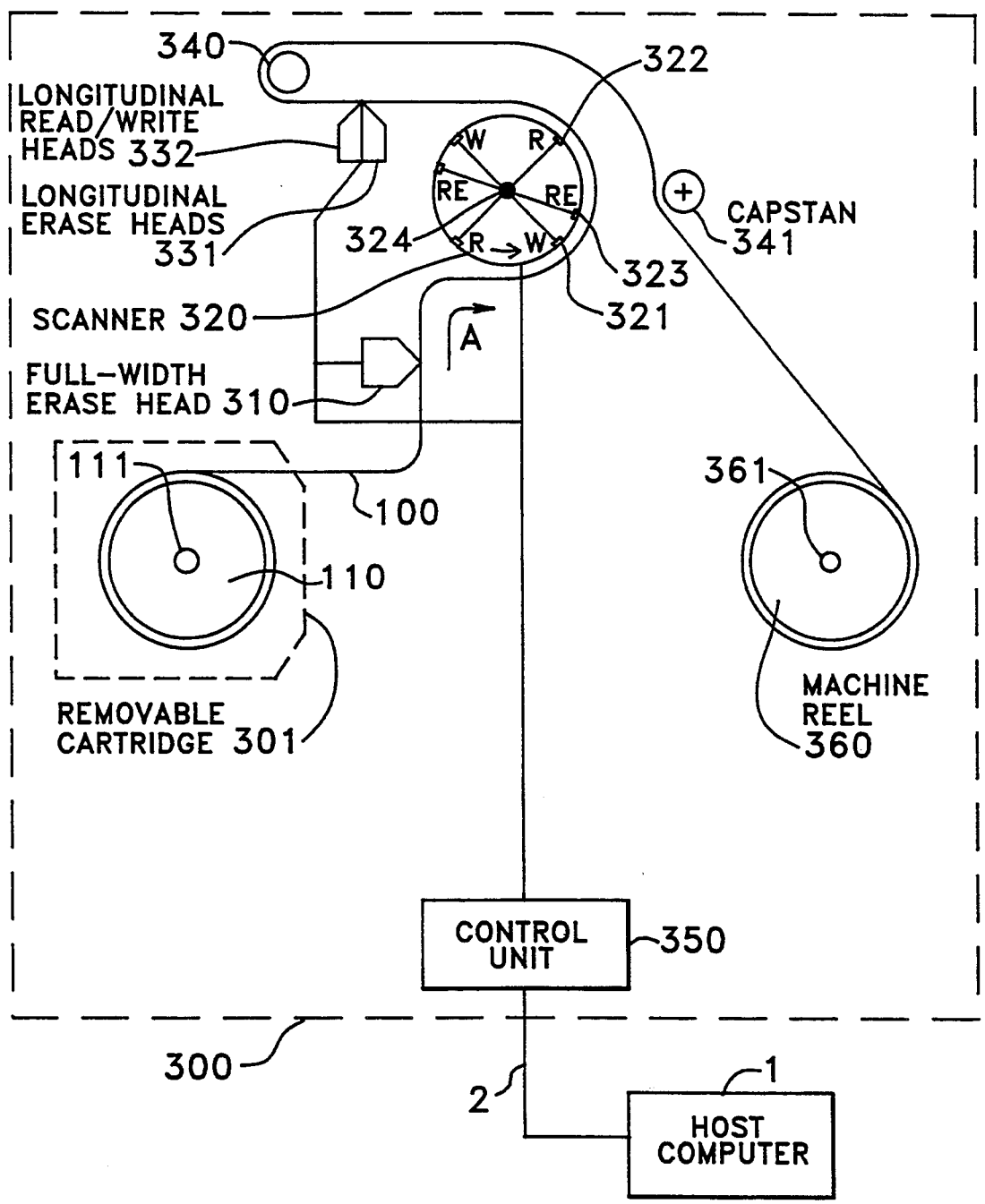
FIG. 3 illustrates in block diagram form the overall architecture of a typical tape drive control unit.

The apparatus illustrated in FIG. 3 represents the well known tape transport elements found in helical scan tape drives 300 that are used to read and write data on magnetic tape 100. The magnetic tape 100 is wound on a single reel 110 which rotates around spindle 111 within magnetic tape cartridge 301. In a helical scan tape drive 300, magnetic tape 100 from magnetic tape cartridge 301 is threaded in direction A past a fixed full width erase head 310, scanner 320 (which contains two pairs of helical read heads 322 and two pairs of helical write heads 321 and one pair of erase heads 323), a fixed longitudinal erase head 331 and a fixed longitudinal read/write head 332. The magnetic tape 100 then passes around guide 340, over capstan 341 to be wound on machine reel 360 which rotates around spindle 361. The full width erase head 310 erases the entire width of magnetic tape 100 and is used when data is recorded on virgin tape. It is also used when data is recorded on a previously used magnetic tape, if none of the data previously recorded on magnetic tape 100 is to be preserved and the entire magnetic tape 100 is overwritten with new data.

Host computer 1 transmits a stream of data records to control unit 350 in tape drive 300, where the data records are formatted for writing in helical scan form on magnetic tape 100 via scanner 320. The tape wrap angle around scanner 320 is slightly greater than 180° so that a pair of read heads 322, a pair of write heads 321 and one erase head 323 are constantly in contact with magnetic tape 100 in order to continuously read and write data thereon. The helical write head pairs 321 simultaneously record two tracks of data at a time on magnetic tape 100 with an azimuth angle between adjacent tracks being plus and minus 20°. Similarly, helical read head pairs 322 simultaneously play back two tracks of data at a time from magnetic tape 100. There are also three fixed longitudinal erase 331 and read/write heads 332 to read and write data on the corresponding three longitudinal tracks contained on magnetic tape 100: control, time code and one to be determined. These three longitudinal read/write heads 332 can be used individually or in any combination when editing new information into pre-recorded data.

Physical Format of Helical Scan Magnetic Tape

Figure 1:
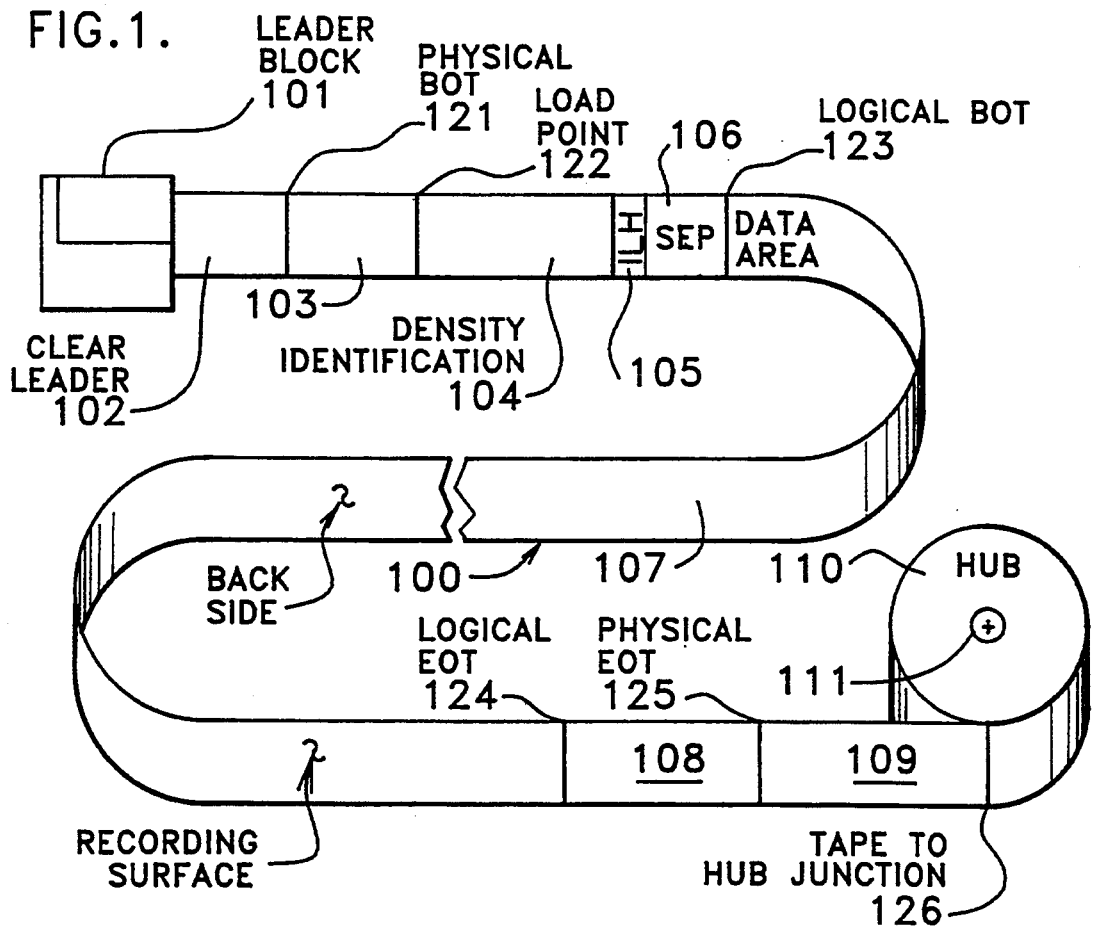
FIG. 1 illustrates the physical format of the magnetic tape media.

FIG. 1 illustrates the physical format of the helical scan magnetic tape 100, including the header segment 105 thereof. The magnetic tape 100 includes a leader block 101 that is attached at one end thereto and a single reel 110 around which magnetic tape 100 is wound into cartridge 301. A length of clear leader 102 is optionally interposed between the physical beginning (BOT) 121 of magnetic tape 100 and leader block 101 in order to protect magnetic tape 100 when it is wound in magnetic tape cartridge 301 around reel 110. A length 103 (typically 3 m) of magnetic tape 100 exists between the physical beginning of tape 121 and a locale, known as the load point 122, at which point the density identification segment 104 of magnetic tape 100 begins. The density identification segment 104 typically consists of 209 scan groups 700 (FIG. 7) written on magnetic tape 100. The density identification segment 104 represents data, for tape drive control unit 350 to access, indicative of the physical characteristics of magnetic tape 100. Internal leader header segment 105 is located at the end of density identification segment 104 of magnetic tape 100. The internal leader header 105 consists of a three scan groups 700, the third of which is an ECC scan group to error check the two preceeding internal leader header scan groups. The internal leader header 105 is followed by separator segment 106 of magnetic tape 100, which typically consists of 300 scan groups. The separator segment 106 isolates the logical beginning of tape (BOT) 123, which is the start of the data area 107 of magnetic tape 100, from the prepended header information described above. The data area 107 of magnetic tape 100 constitutes the majority of magnetic tape 100 and ends at the logical end of tape 124 which is a predetermined distance from tape to hub junction 126, wherein magnetic tape 100 is affixed to single reel 110 of magnetic tape cartridge 301. A length of trailer tape 109 may be interposed between the physical end (EOT) of tape 125 and tape to hub junction 126. This serves as a method of attaching magnetic tape 100 to reel 110 in order to provide a secure method of attachment thereto.

Internal Leader Header

The internal leader header 105 consists of administrative information which typically includes:
  Data Record Directory
  Tape mark locations
  Read Block ID locations
  The record IDs at sub-sector boundaries
  Administrative Information
  Last scan group that was written (the end scan group)
  Location of last Data Scan group written
  Number of volume loads
  Flag that third level ECC had to be invoked on read (marginal tape should be replaced)
  Number of read/write errors for the last x mounts
  Serial number of last y drives upon which this cartridge was mounted
  Volume ID
  Time and data stamp of mount
  Tape type and length
  Other pertinent information from Event Log and Buffered Log
  Safe File information
  Manufacturer's ID and Production Batch Numbers The internal leader header segment 105 of magnetic tape 100 is read on every load of magnetic tape cartridge 301 into a tape drive 300. The internal leader header segment 105 is updated by magnetic tape drive 300 prior to magnetic tape 100 being physically unloaded therefrom in order to update the header information concerning read and write information contained therein. The internal leader header 105 illustrated in FIG. 5 includes two segments: administrative information 501, and data record search directory 502. The data record search directory 502 includes a plurality of entries (502-1 to 502-n), one for each major delimiter (such as: read block ID, sector boundary and tape mark) written on to magnetic tape 100.

Data Record Directory

Figures 5, 6, 10:
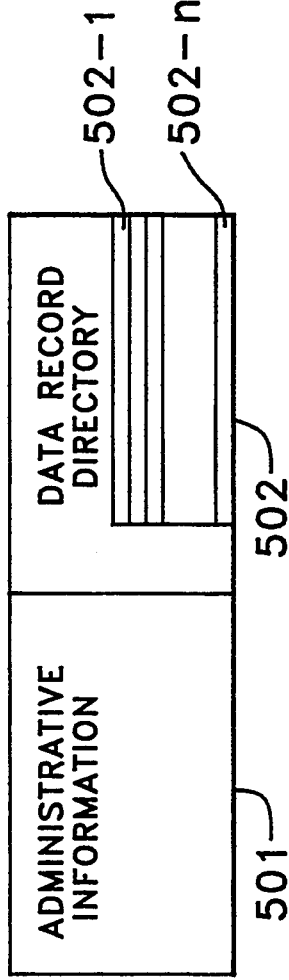
FIG. 5 illustrates the elements contained in the header segment of the magnetic tape.
FIG. 6 illustrates the elements contained in the directory section of the header segment of the magnetic tape.
FIG. 10 illustrates the elements contained in the administrative section of the header segment of the magnetic tape.
Figure 22:
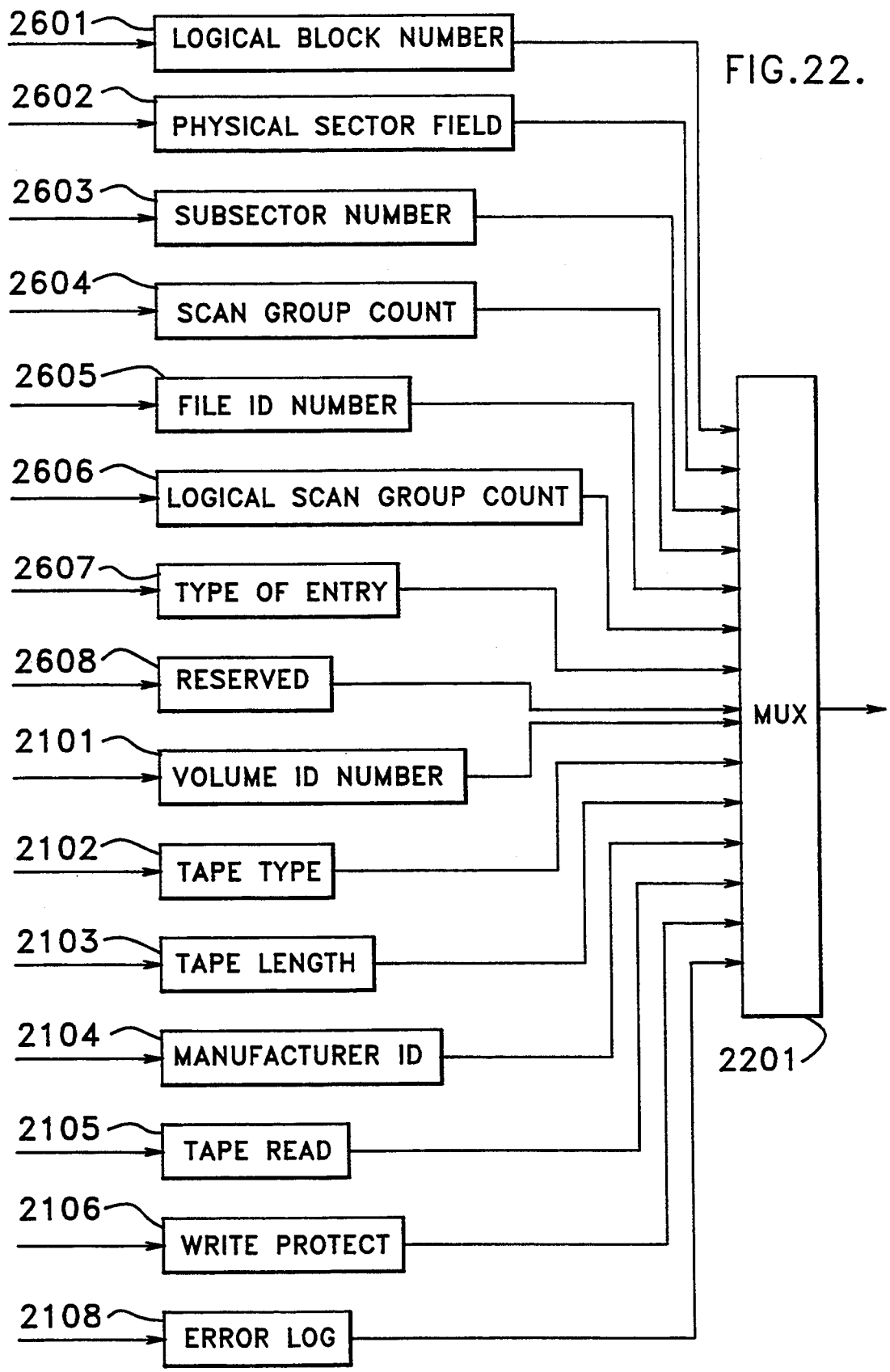
FIG. 22 illustrates in block diagram form the elements used to create and update the internal leader header section of the magnetic tape.

Each directory entry 502-* includes the information illustrated in FIG. 6 and written by the apparatus illustrated in FIG. 22. In fact, the apparatus of FIG. 22 can be software elements located in tape drive control unit 350 used to create a scan group 700 for internal leader header 105. A logical block number 601 is a five byte long field created by element 2601 that uniquely identifies every block written on to magnetic tape 100. This block number identifies each successive data record on magnetic tape 100 by a logical block number 601 which represents the logical block number of the previously written data record incremented by one. The second element in each entry is created by element 2602 and is the physical sector field 602 of one byte length, which is the concatenation of the direction bit and segment number used in the LOCATE BLOCK command in 3490E-type tape drives. The third element in the entry is the subsector number 603 which is a one byte field created by element 2603 that divides each physical sector into three smaller increments, thereby allowing a high speed portion of a search to position the tape closer to the requested logical block. The fourth element in the entry is a scan group count 604 of four bytes length created by element 2604 which represents a unique physical location on magnetic tape 100. Every scan group 700 written on to magnetic tape 100 has a unique scan group number assigned to it in order to identify scan group 700 and differentiate it from all other scan groups 700 written on magnetic tape 100. The fifth element contained in the entry is a file identification number 605 of three bytes created by element 2605 and which identifies a numerical file in which scan group 700 is contained. The file identification 605 is used internally in tape drive 300 and is transparent to host computer 1. This file ID number 605 provides a scan group to file correspondence in order to simplify the administering of the data on magnetic tape 100. The sixth element in the entry is a logical scan group count 606 of four bytes created by element 2606 and that provides an identification of the logical scan group in which this data record is written. The seventh element in the entry is created by element 2607 and is an identification 607 of the type of entry written on magnetic tape 100. The final element in the entry is a reserved field 608 of four bytes for future use as to be determined for future elements 2608.

Administration Information

FIG. 10 illustrates the information typically contained in the administration information section 501 of internal leader header 105. A first segment of information contained in internal leader header 105 is the volume identification 1001 which consists of seven bytes created by element 2101 that represent the volume identification number assigned to magnetic tape cartridge 301. A second section of administrative information 501 is the tape type, which is a two byte long field created by element 2102 to indicate whether this is a write protect tape, a tape with no third level ECC, etc. The third segment 1003 of administrative information 501 created by element 2103 consists of a one byte indicator of tape length. A fourth segment 1004 of administrative information created by element 2104 is the tape manufacturer's identification and production batch number, which consists of 128 bytes of information, to provide the user with information concerning the date of manufacture of this media as well as the identification of the manufacturer and their particular production batch number. This information assists the user in identifying media that has been recalled by the manufacturer or media of a certain class that is more prone to errors than other similar types of media.

Further entries that can be included in administration information 501 are tape drive data 1005 created by element 2105 indicative of the number of times that magnetic tape cartridge 301 has been loaded on tape drive 300 and the number of read and write cycles magnetic tape 100 has been subject to. This tape drive data can include the serial number of tape drive 300, as well as date and time stamps to record load activity. Another entry 1006 is a write protect flag byte created by element 2106 to indicate write protect status of magnetic tape 100. Further information includes error data 1008 created by element 2108, including a flag that indicates that the third level ECC had to be invoked on a read operation thereby indicating that this tape can be marginal and should be replaced by the user. This error data includes a record of the number of read/write errors detected and corrected in the last n times the magnetic tape is mounted on a tape drive as well as the identification of the tape drives upon which this magnetic tape was mounted. The error data 1008 includes a collection of all the error statistics that are produced during the last n mounts in order to enable host computer 1 to access this information in order to determine whether magnetic tape 100 is flawed or whether the associated tape drive 300 on which is was mounted is experiencing regular failures. Finally, additional memory is provided for future use to enable magnetic tape 100 to store predefined information, either selected by the user or defined by the tape drive manufacturer.

Data Format of the Helical Scan Magnetic Tape

Figure 2:
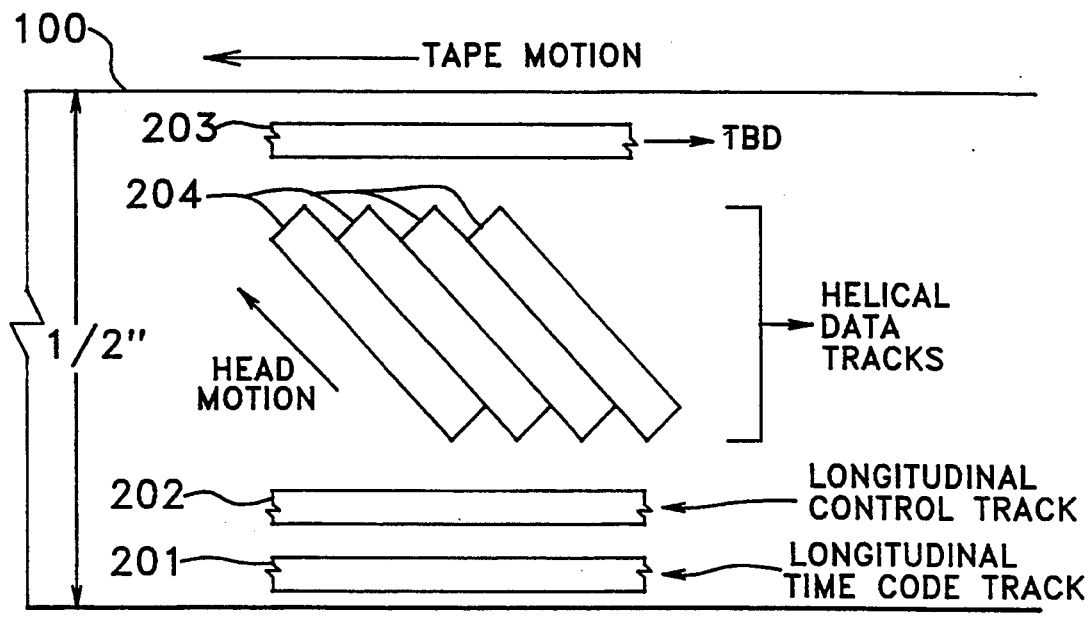
FIG. 2 illustrates the data recording format of helical scan magnetic tape.
Figure 7:
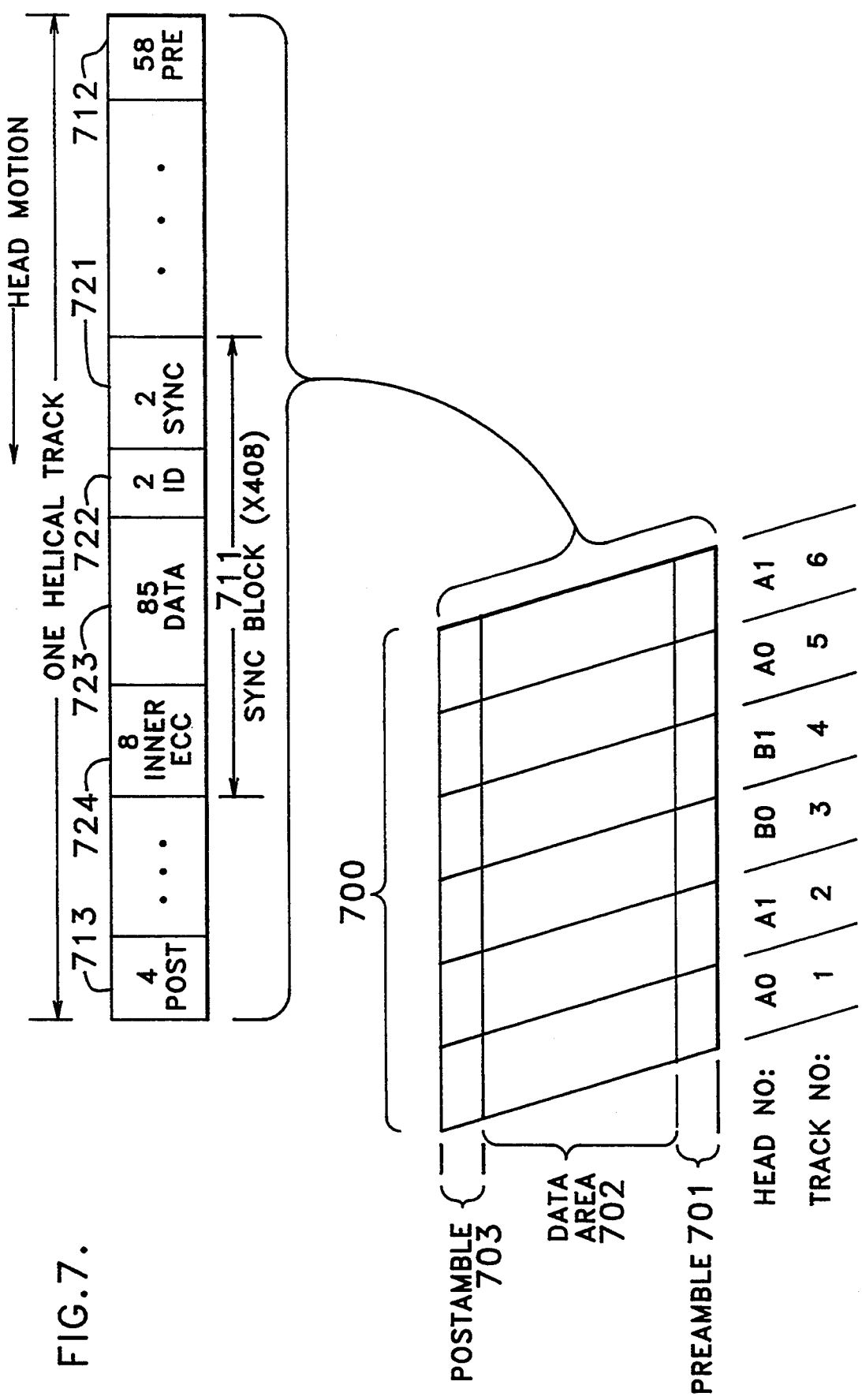
FIG. 7 illustrates additional detail of the data recording format of the helical scan magnetic tape.

FIGS. 2 and 7 illustrate the data recording format of helical scan magnetic tape 100 used herein. Magnetic tape 100 is divided into 182 sectors, each of which is subdivided into a plurality of scan groups 700. The scan group 700 is the basic unit for formatting data on magnetic tape 100. As two adjacent write heads 321 of scanner 320 move across magnetic tape 100, two helical tracks 204 of data are simultaneously written on to magnetic tape 100. Once scanner 320 has completed one half of a revolution, the other pair of write heads 321 begins to write the next two adjacent tracks 204 on to magnetic tape 100. One and a half revolutions of scanner 320 produce the six tracks (1–6) illustrated in FIG. 7 to complete a single scan group 700. As can be seen from FIG. 7, a postamble 703 and preamble 701 are written on either end of the data area 702 of each track 204 written on to magnetic tape 100 in order to enable read heads 322 to accurately read the data contained therein.

In addition, the data format of a single helical track is illustrated in FIG. 7 to note that preamble 712 consists typically of fifty-eight bytes of data and postamble 713 includes four bytes of data. Interposed between preamble 712 and postamble 713 are 408 sync blocks 711, each of which contain eighty-five bytes of user data 723. In addition, two synchronization bytes 721 are prepended to data 723 along with two identification bytes 722. Eight bytes of inner error correcting code 724 are appended to the end of data 723 in order to complete the format of sync block 711. The inner ECC code 724 illustrated in FIG. 7 covers both data 723 and identification 722 but not synchronization bytes 721 contained in sync block 711. Therefore, a 93, 85 Reed Solomon code is formed to detect errors contained in data 723 and identification 722 fields of sync block 711. The sync pattern 721 portion of sync block 711 is a fixed pattern of data bits used to resynchronize the read clock and logic after dropouts. Of the 408 sync blocks 711 in a single track 204, twenty-four are used at the start of track 204 for outer ECC check bytes (described below). Therefore, there are (408−24)×85=32,640 bytes per track 24 of user data 723. With six tracks 204 per scan group 700, a scan group 700 therefore contains 97,920 bytes of user data 723.

Figure 9:
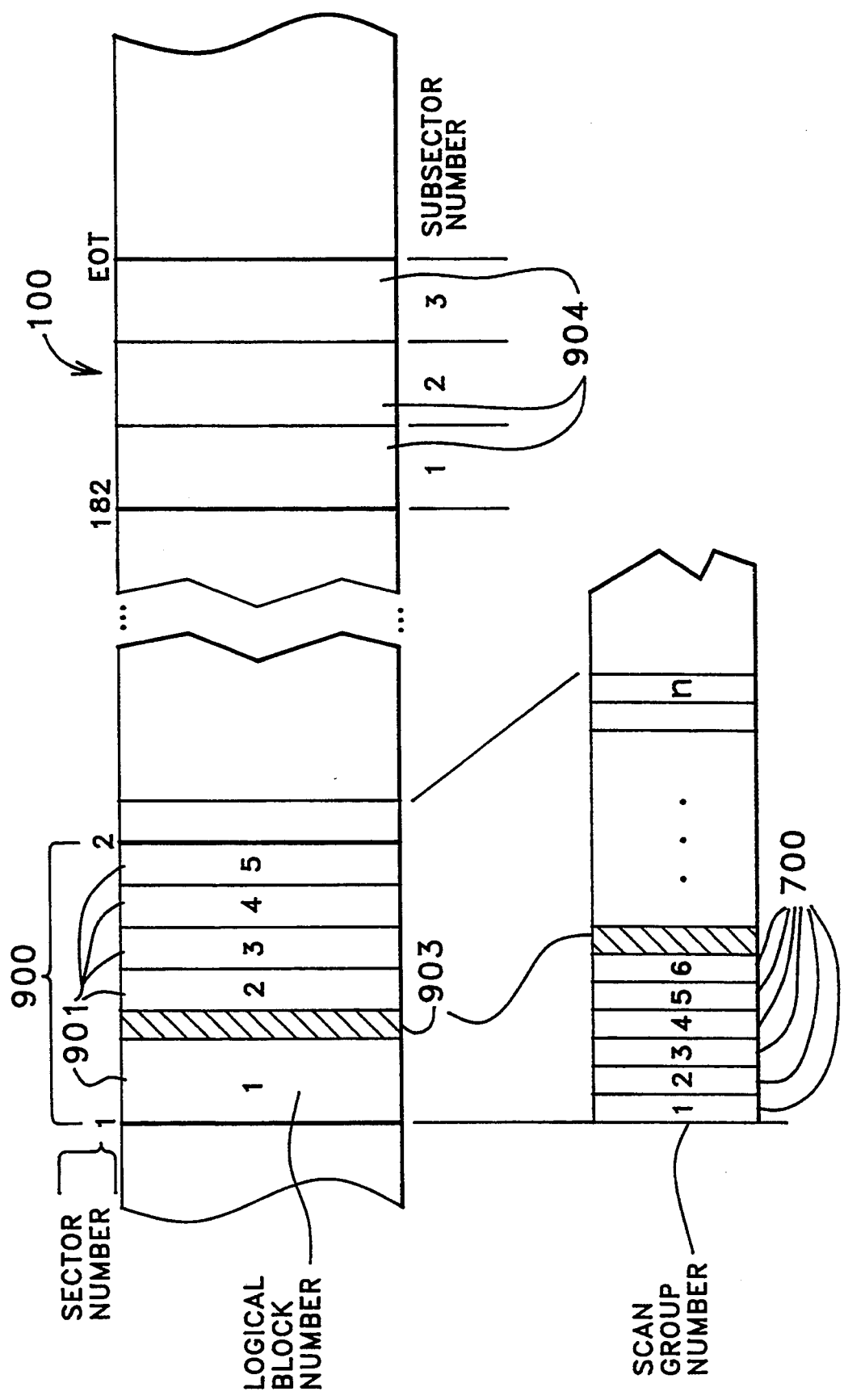
FIG. 9 illustrates the positioning information recorded on the magnetic tape.

FIG. 9 illustrates the positioning information recorded on the magnetic tape 100. The basic unit used to transfer data from the host computer 1 to magnetic tape 100 is the data block 901, which is analogous to a conventional data record. Each data block 901 sent by the host computer 1 to be written to magnetic tape 100 is sequentially assigned a unique block number by the tape drive control unit 350. Data blocks 901 are logical entities which may have different lengths, unlike fixed length blocks which are required by some prior art magnetic recording systems. A data block 901 may be larger than a physical scan group 700, and may also span two adjacent scan groups 700. Since each physical scan group 700 is the same size, the variable size of the data blocks 901 is transparent to the tape drive control unit 350 when a high speed data block search is conducted using the longitudinal track servo information in conjunction with the scan group location in the internal leader header 105.

Data block IDs are placed at all sector/subsector 900/904 boundaries in order to provide a mechanism for increasing the speed of a search, and for verifying the location of the contiguously stored data block 901. These data block IDs are referred to as "host block IDs" since the data block 901 is the basic unit used by the host computer 1 to write data to magnetic tape 100. Subsector 904 boundaries are locatable via the servo control track 202 at a 100X search speed. The fact that block IDs are placed at all subsector 904 boundaries allows a search for a specified block to be made which is three times closer in proximity to the specified data block 901 than a search using only whole sector 900 boundaries. Furthermore, the placement of block IDs at subsector 904 boundaries provides a verification of the correctness of a search to a particular subsector 904 wherein a block having a predetermined (expected) ID is expected to be found.

The scan group header included in the scan group 700 typically includes the following information:

| | |
|---|---|
| 1. Type of scan group | 1 byte |
| 2. Logical scan group number | 4 bytes |
| 3. Beginning host block ID (Block ID of byte 0) | 5 bytes |
| 4. Ending host block ID (Block ID of last byte) | 5 bytes |
| 5. File ID number | 3 bytes |
| 6. Number of pad bytes in logical scan group | 3 bytes |
| 7. Information data byte: File safe bit Write-without-retry bit | >--> 1 byte |
| 8. Continuation Information: First host block continued from previous scan group bit Ending host block continues into next scan group bit | >--> 1 byte |
| 9. Scan group CRC | 2 bytes |
| 10. Scan group header CRC (fixed) | 2 bytes |
| 11. Pointer to first packet that begins in this scan group | 3 bytes |
| 12. Variable Information: | |
| Physical Scan Group Count | 4 bytes |
| Copy Count | 1 byte |
| Variable CRC | 2 bytes |
| 13. If an ECC group, the number of data groups covered by this ECC. If a data group, the sequence number within this ECC super-group. | 1 byte |
| SUB TOTAL | 38 |
| RESERVED | 26 |
| TOTAL | 64 |

Longitudinal Tracks

The tape format for helical scan recorded magnetic tape 100 includes three longitudinal tracks 201-203 written on magnetic tape 100: servo control track 202, time code track 201 and one track 203, the use of which is to be determined. The servo control 202 and time code 201 tracks are located at the bottom of magnetic tape 100 while the unused track 203 is located at the top of magnetic tape 100. The servo control track 202 is recorded as helical tracks 204 are written onto magnetic tape 100 and contains pulse doublets that mark the location of each helical track preamble written on to magnetic tape 100. One use of servo control track 202 is to synchronize, during playback, the rotation of scanner 320 with the position of helical tracks 204 on magnetic tape 100. Another use of servo control track 202 is to position magnetic tape 100, while being transported at a 100X normal recording speed, to a specified scan group 700, based on scan group location information contained in the data record directory section 502 of internal leader header 105.

The time code track 201 is recorded as new helical tracks 204 are written on to magnetic tape 100. The time code track 201 contains location information that uniquely identifies each scan group 700 on magnetic tape 100. Similar location information is contained in the helical tracks 204 themselves, but the longitudinal time code track 201 can be read at a higher tape speed, i.e., at 60X normal recording speed. The longitudinal time code track 201 can be used to locate file marks (tape marks) on magnetic tape 100 during the high speed search activity. The various high speed search operations of the present invention are used to position a particular physical location on magnetic tape 100 under the read/write heads 321, 322 of scanner 320 in a significantly faster time than prior art methods. These methods include positioning the tape to an approximate location of a desired data block, or, less efficiently, searching for the desired data block by performing a continuous read operation until the data block is located.

The servo system in a typical tape drive such as that used by the present method is capable of performing a high speed search to a scan group 700 which can be located via longitudinal track 202 on magnetic tape 100. The servo can locate a particular video frame consisting of a group of twelve helical tracks 204 or two scan groups 700. By using servo control track 202, tape transport 300 can perform a high speed search at 100X normal recording speed to within one scan group containing the data record that is requested. This is a much finer resolution than can be obtained by using a simple but less accurate distance measurement employed by prior art physical data identification techniques.

Write Data Path

Figure 4:
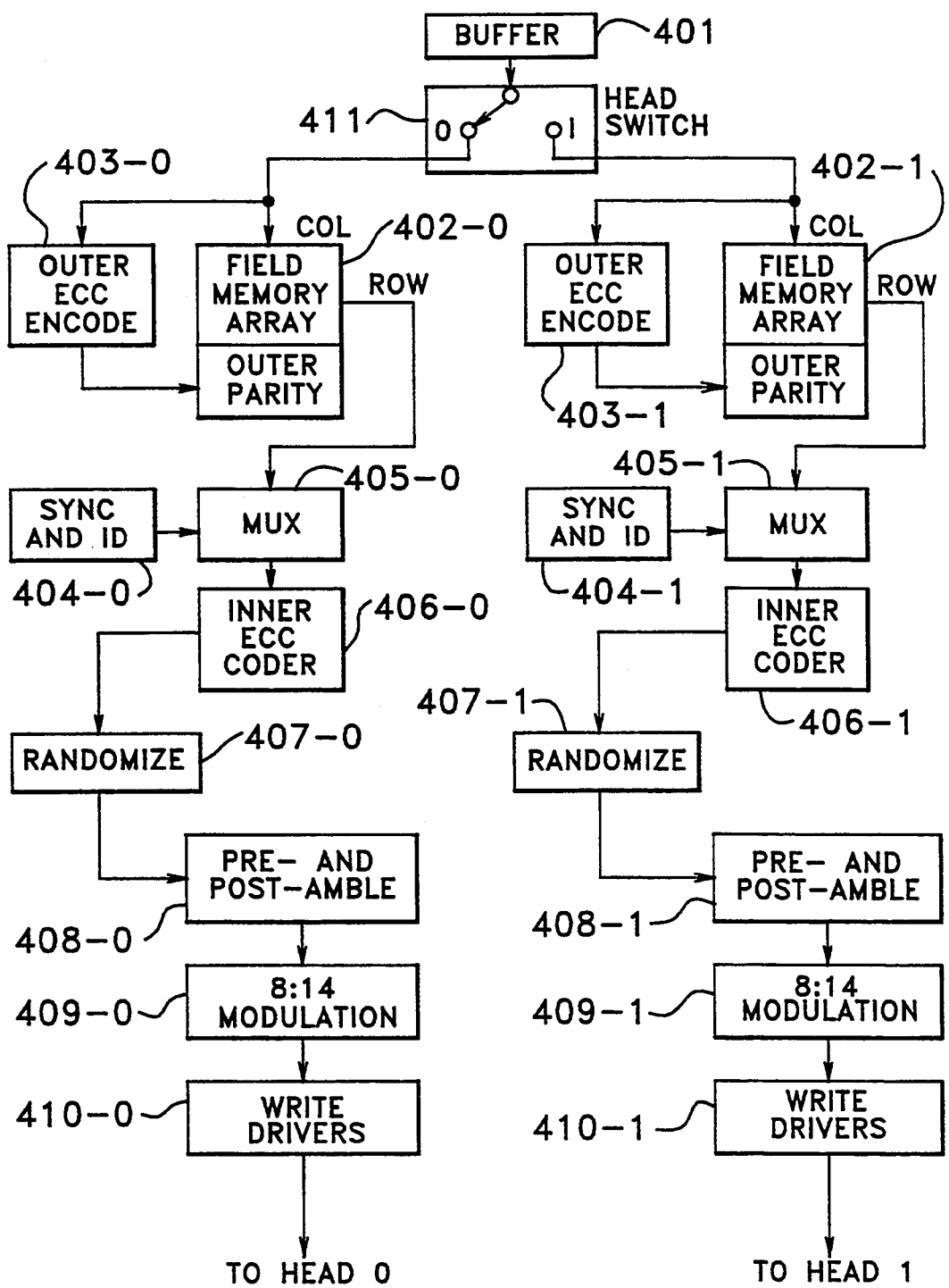
FIG. 4 illustrates in block diagram form the write circuits in the tape drive control unit.
Figure 8:
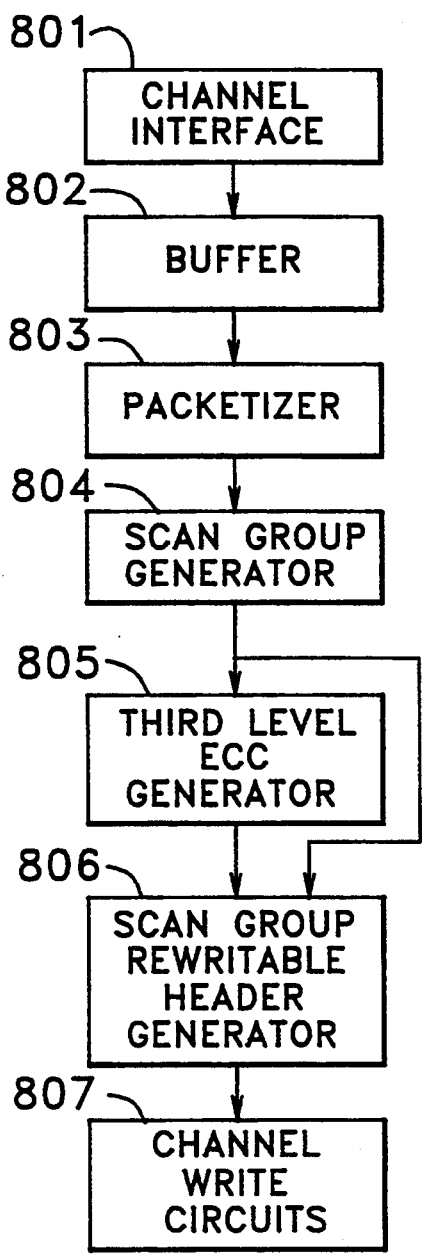
FIG. 8 illustrates in block diagram form the architecture of the write data path in the tape drive control unit.

FIGS. 4 and 8 illustrate in block diagram form the architecture of the write data path contained within tape drive control unit 350 while FIGS. 13-16 illustrate data formats used therein. The write data path includes a channel interface circuit 801 which interconnects tape drive control unit 350 with data channel 2 from host computer 1. Channel interface circuit 801 receives data blocks from host computer 1 and stores them in buffer 802 for processing by the hardware and software contained in tape drive control unit 350. Buffer 802 stores a predetermined amount of data that is received from host computer 1. A typical buffer size is 16 Mb in order that host computer 1 can write a significant amount of data into tape drive control unit 350 without requiring interruption of the data transfer caused by the movement or delay in movement of the magnetic tape 100 on tape drive 300.

Figure 14:
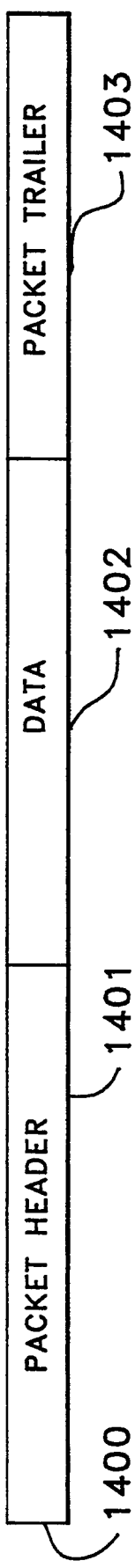
Figure 15:
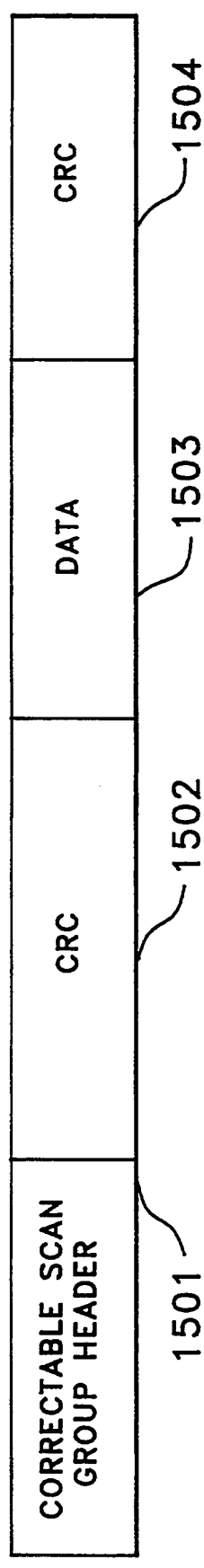
Figure 16:
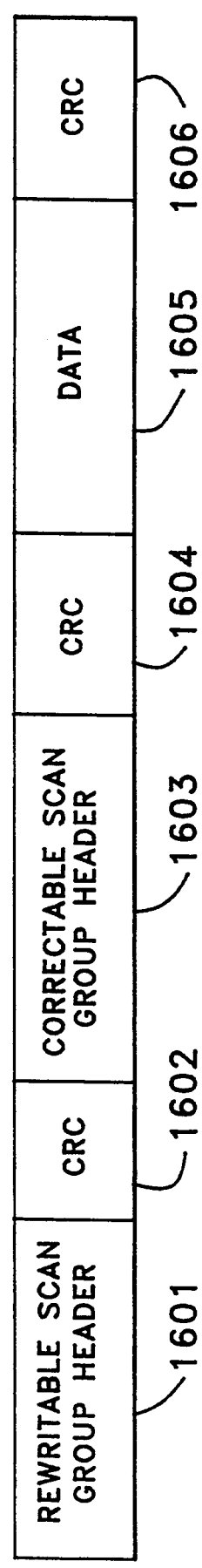

Packetizer circuit 803 retrieves data from buffer 802 and packetizes the data 1401 as shown in FIG. 14 by adding a packet header 1402 which is protected by a cyclic redundancy check (CRC) (not shown). Data records received from host computer 1, whose block size do not exceed 262K bytes, are followed by a packet trailer 1403 and a CRC (not shown) which protects both data 1401 and packet trailer 1403. The packets 1400 produced by packetizer 803 are transmitted to scan group generator 804 which reformats the packetized data 1400 into scan groups 1500 as shown in FIG. 15. If a scan group data field is incomplete, pad bytes are added to the scan group data field 1501 as required to complete the scan group data field 1501. A correctable scan group header 1502 and a two byte CRC character 1503 are then prepended to the scan group data field 1501 and a CRC code 1504 also appended thereto. The completed scan group 1500 thus generated is transmitted to third level ECC generator 805 which Exclusive ORs (for example) twenty-four scan groups 1500 to produce a third level ECC scan group. In addition, the scan groups 1500 are concurrently transmitted to re-writeable scan group header generator 806 which produces, as shown in FIG. 16, a rewriteable scan group header 1601 and CRC code 1602 which protects this rewriteable scan group header 1601, both of which are prepended to the scan groups 1603. The resultant data 1600 is then transmitted to the channel write circuits 807 for writing the data in helical scan format on to magnetic tape 100.

Channel Write Circuits

FIG. 4 illustrates in block diagram form the details of a typical channel write circuit 807. A head switch 411 selects data to be written to one or the other of the two parallel write heads 321 via two parallel write paths (402-* to 410-*). The data that is transferred from buffer 401 through head switch 411 is written into a field memory array 402 so that the data can continuously be supplied to rotating write heads 321.

Outer ECC Encoder

While the data is being read in 128 byte segments into field memory array 402, it is also applied to the input of outer ECC encode circuit 403 to produce 8 check bytes of a Reed Solomon error correcting code to detect errors in the data that is written to and subsequently read from magnetic tape 100. The Outer ECC Encoder 403-* produces a Reed Solomon code RS(136,128) using a Galois Field of 256. The representation of the Galois Field used by outer ECC encoder 403-* is that generated by the primitive polynomial:

$$p(x) = x^8 + x^4 + x^3 + x^2 + + 1$$

The outer ECC generator polynomial is:

$$G(x) = (x+1)(x+a)(x+a^2)(x+a^3)(x+a^4)(x+a^5)(x+a^6)(x+a^7)$$

where "a" denotes the primitive element of the field and is equal to 00000010 binary. The field memory array 402 is divided into two equal segments so that an equivalent amount of data can be supplied each of the pair of write heads 321 on scanner 320. The data from buffer 401 is written into field memory array 402 on a column by column basis, from column 0 to column 764, and is read out of field memory array 402 on a row by row basis, from row 0 to row 135 including the 8 byte parity code generated by outer ECC encode circuit 403. The field memory array 402-* therefore has a memory capacity of 765 columns * 136 rows =104,040 bytes. The data stored therein are read out by rows to form sync blocks of eighty-five data bytes each, or nine sync blocks per row.

A multiplexor circuit 405 incorporates the data obtained from field memory array 402 with the data from synchronization and identification circuit 404. To each eighty-five sync block is added a two byte identification field which contains a sync block identification number which is incremented by one for each subsequent synchronization block received by channel write circuits 811. The eighty-seven byte block resulting from the concatenation of the two synchronization ID bytes and the eighty-five data bytes read from field memory array 402-* is then passed to inner ECC encoder circuit 406-*.

Inner ECC Encoder

The inner ECC encoder 406-* appends eight check bytes to each eighty-seven byte block received from multiplexor 405-*. The inner ECC encoder 406-* is a Reed Solomon code generator RS(95,87). The Galois field used by inner ECC encoder 406-* is GF(256) and the representation used by inner ECC encoder 406-* is that generated by the primitive polynomial:

$$V(x) = x^8 + x^4 + x^3 + x^2 + 1$$

The inner ECC generator polynomial is therefore:

$$G(x) = (x+1)(x+a)(x+a^2)(x+a^3)(x+a^4)(x+a^5)(x+a^6)(x+a^7)$$

Where "a" denotes the primitive element of the field and is equal to 00000010 binary.

The resultant ninety-five byte block is randomized by randomizer circuit 407-* by exclusive ORing the serial eighty-seven byte data block data stream and the serial data stream generated by the inner ECC encoder polynomial. The random generator is initialized to 80(hex) at the first byte of each inner ECC encoder word. The resultant data is then applied to the input of preamble and postamble circuit 408 which completes the data formatting operation. An 8:14 modulator circuit 409 modulates the resultant data and drives the write driver circuits 410 to write the data on magnetic tape 100 via write heads 321 on scanner 320. The write drivers 410 send the serial bit stream through a rotary transformer to write head 321 to write data in groups of 2×144 KB to write 288 KB of data on magnetic tape 100. This circuitry is well known in the helical scan data processing art and is not described in any further detail herein.

Third Level ECC

The scan groups 1500 include inner and outer ECC codes, as described above, to protect individual scan groups and can detect and correct a number of errors in the individual scan group 1500 in which they are generated. However, once a number of errors contained in the scan group 1500 exceed the capacity of these two error correcting codes, data is lost. Therefore, a third level error correcting code is used, which operates at the scan group level and can replace one entire uncorrectable scan group. The third level error correcting code is a parity scan group system in which one parity scan group is written for each twenty-four data scan groups. In this configuration, as these scan groups are generated, N scan groups are exclusive ORed together in order to form a parity scan group. The quantity N is variable and can be controlled by the software contained in control unit 350. The exclusive ORing is performed on a byte by byte basis such that the first byte of the parity scan group is the exclusive ORing of all of the first bytes of the N scan groups that are being protected. When a scan group includes pad characters to fill a scan group that is not completely filled with host data, the third level ECC includes the pad characters in the accumulation of the parity scan group. Any non-data scan groups that appear in the stream of scan groups written on magnetic tape 100 are not included in the parity calculation and these non-data scan groups can include tape mark scan groups or pad scan groups. The collection of the N scan groups and their associated parity group are referred to as a super group. The parity group for a super group includes in its header a flag in the type field to indicate that this is a parity scan group. The scan group header for the parity scan group also contains a field that specifies the number of data scan groups that belong to this super group.

When a significant number of errors occur in a scan group beyond the capability of the inner and outer ECC codes to correct, the parity scan group is used to reconstruct the uncorrectable scan group. This is accomplished by Exclusive ORing all of the valid scan groups that comprise the super group which contains the bad scan group. The exclusive ORed combination of the valid scan groups are exclusive ORed with the parity scan group to compute a version of the bad scan group which can then be written to the data buffer to replace the bad scan group. In this computation process, the scan group header of the uncorrectable scan group receives special processing since the scan group header is divided into two sections, one which is correctable 1502 and the other which is rewriteable 1501. Certain fields are contained in the header which do not change when a group is rewritten, such as logical scan group number, scan group CRC and host record information, all of which are placed in the correctable area 1502 of the scan group header which itself is protected by its own CRC field 1503. The rewriteable area 1601 of the header contains the retry count, physical scan group number, scan group type field and its own CRC field 1602. The type fields must be in the rewriteable area 1601 because the type fields of the parity scan group must indicate it is a parity scan group and therefore can not be an exclusive OR of the data scan group type fields. Similarly, the rewriteable area 1601 of the parity scan group also includes a field denoting the number N of scan groups that are contained within the super group. For the individual data scan groups within the super group, this field denotes the sequence number within the super group of this data scan group. Therefore, certain segments of the header of the uncorrectable scan group must be corrected and others segments rewritten with data that matches their particular informational content that can not be obtained by Exclusive ORing all of the valid scan groups in the parity scan group within the super group. However, this information can be recreated by the control unit 350 without the need to perform the Exclusive ORing information as is done with the data reconstruction segment of the scan group.

Third Level ECC Hardware System

Figure 21:
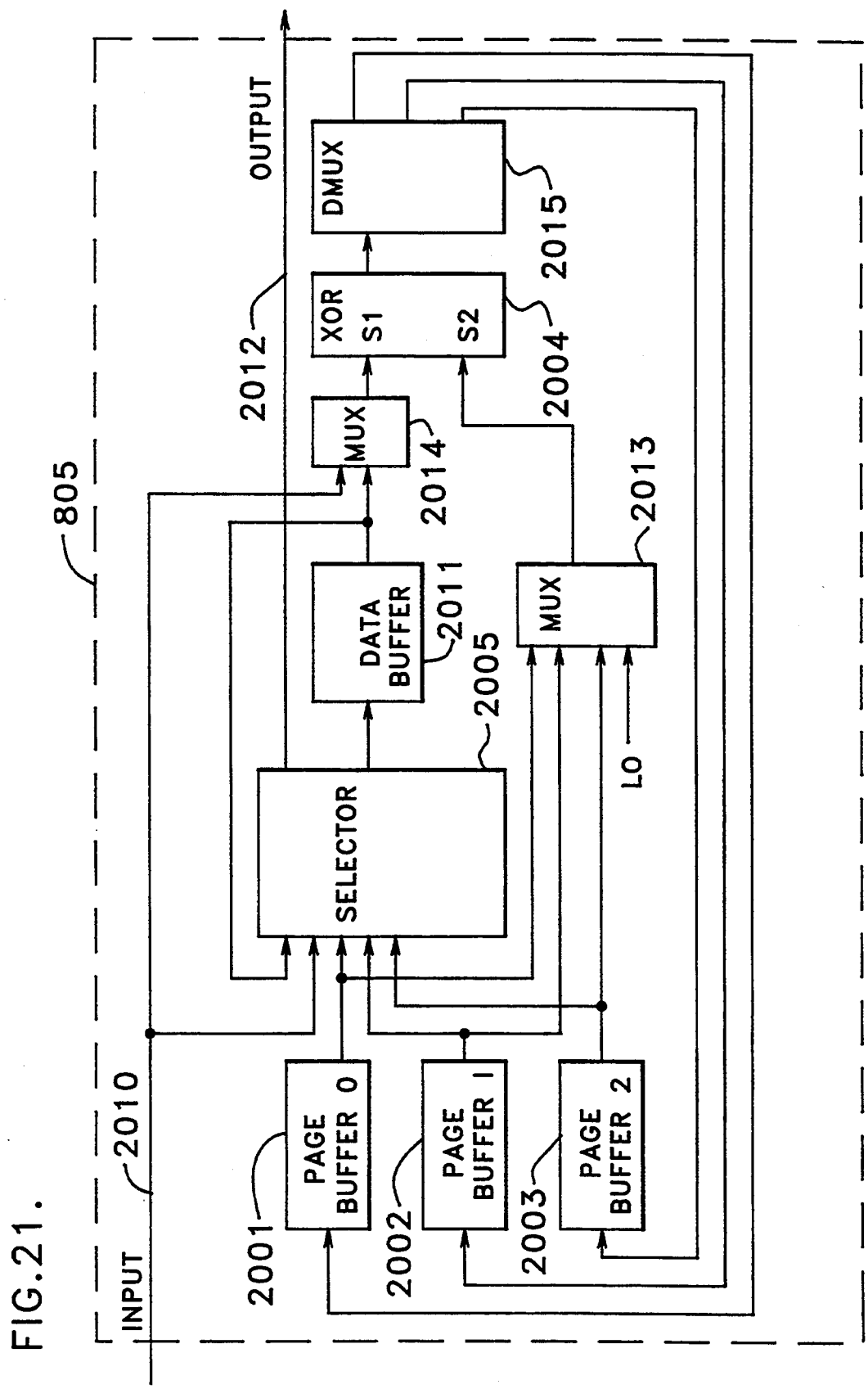

FIG. 21 illustrates in block diagram form the hardware elements which comprise the third level ECC generator 805. Three parity buffers 2001-2003 are provided for the accumulation of parity scan groups during tape writes and the reconstruction of an uncorrectable scan group during tape reads. Each of buffers 2001-2003 can contain one entire parity scan group. These three buffers 2001-2003 are referred to as ECC page buffers 0, 1 and 2, respectively. A two input Exclusive OR element 2004 is also provided to accumulate parity scan groups as magnetic tape 100 is written to or to accumulate a reconstructive scan group as magnetic tape 100 is read. A data selector 2005 is also provided so that the completed parity scan groups can be routed to their final destinations. The data selector 2005 contains five inputs: the output of data buffer 2011, input port (INPUT), ECC page buffer 0 output, ECC page buffer 1 output and ECC page buffer 2 output. The output of data selector 2005 is connected to the data output port (OUTPUT) and also to the input of data buffer 2011. Data is transmitted to data buffer 2011 only when specified by control unit 350.

The two inputs of the Exclusive OR element 2004 are both programmable (and shown as multiplexors 2013, 2014) and are switchably interconnected at the start of each scan group being input to third level ECC generator 805. Source 1 of the Exclusive OR element 2004 is connected via multiplexor 2014 to either the input port 2010 or the output of data buffer 2011, depending whether the operation is a tape read or a tape write. Source 2 of the Exclusive OR element 2004 is connected via multiplexor 2013 to the ECC page buffers 0, 1 or 2 or can be set to 0 (shown as L0). The output of the Exclusive OR element 2004 can be routed back via demultiplexor 2015 to any of the ECC page buffers 0, 1 or 2 or it can be ignored for cases where the input to third level ECC generator 805 is not a scan group which should be used as part of the present parity accumulation. The following table denotes the possible input and output connections for Exclusive OR element 2004:

|                   | Source 1 | Source 2 | Destination |
|-------------------|----------|----------|-------------|
| Data buffer       | x        |          |             |
| Data input port   | x        |          |             |
| all zeros         |          | x        |             |
| ECC page buffer 0 |          | x        | x           |
| ECC page buffer 1 |          | x        | x           |
| ECC page buffer 2 |          | x        | x           |
| null              |          |          | x           |

Tape Write Operations

This section describes how the hardware elements described above are used during tape writes. For a normal tape write, the output of the data selector 2005 is disconnected from the input of data buffer 2011 and data flows into the output port 2012. The sequence of operations used is illustrated in Table 1.

If a CRC error is detected while reading a data group from the data buffer 2010, the operation must be retried using same Exclusive OR sources as before. For example, if a CRC error happens the first time data scan group 2 is read, the sequence is shown in Table 2.

When a super-group is complete, the parity scan group must be saved while the next super-group is begun in case the parity group must be rewritten due to failure of the read-back check. This requires use of the third ECC page buffer as shown in Table 3.

Tape Read Operations

This section describes how the hardware elements are used during tape reads. For tape reads, the third level of ECC can be used to reconstruct a single uncorrectable scan group if the remainder of the super-group, including the parity scan group, is good. The software attempts to perform this process on the fly without backing up magnetic tape 100. However, in cases where the read did not begin at a point including the beginning of the super-group containing the bad data scan group, magnetic tape 100 has to be backed up to perform an error recovery attempt.

For reads the output of data selector 2005 must be enabled to the input of data buffer 2011. Assuming that the fourth scan group fails to read properly and must be reconstructed, the sequence of operations shown in Table 4 could be used.

TABLE 1

| Data scan group # | XOR source 1 | XOR source 2 | XOR destination | Data selector |
|---|---|---|---|---|
| 0  | data buffer | all zeroes | buffer 0 | data buffer |
| 1  | data buffer | buffer 0   | buffer 1 | data buffer |
| 2  | data buffer | buffer 1   | buffer 0 | data buffer |
| 3  | data buffer | buffer 0   | buffer 1 | data buffer |
| 23 | data buffer | buffer 0   | buffer 1 | data buffer |
| —  | N/A         | N/A        | null     | ECC buffer 1 |

TABLE 2

| Data scan group # | XOR source 1 | XOR source 2 | XOR destination | Data selector |
|---|---|---|---|---|
| 0  | data buffer | all zeroes | buffer 0 | data buffer |
| 1  | data buffer | buffer 0   | buffer 1 | data buffer |
| 2  | data buffer | buffer 1   | buffer 0 | data buffer |
| 2  | data buffer | buffer 1   | buffer 0 | data buffer |
| 3  | data buffer | buffer 0   | buffer 1 | data buffer |
| 23 | data buffer | buffer 0   | buffer 1 | data buffer |
| —  | N/A         | N/A        | null     | ECC buffer 1 |

TABLE 3

| Data scan group # | XOR source 1 | XOR source 2 | XOR destination | Data selector |
|---|---|---|---|---|
| 0A  | data buffer | all zeroes | buffer 0 | data buffer |
| 1A  | data buffer | buffer 0   | buffer 1 | data buffer |
| 23A | data buffer | buffer 0   | buffer 1 | data buffer |
| —   | N/A         | N/A        | N/A      | ECC buffer 1 |
| 0A  | data buffer | all zeroes | buffer 0 | data buffer |
| 1B  | data buffer | buffer 0   | buffer 2 | data buffer |
| 23B | data buffer | buffer 0   | buffer 2 | data buffer |
| —   | N/A         | N/A        | N/A      | ECC buffer 2 |
| 0C  | data buffer | all zeroes | buffer 0 | data buffer |
| 1C  | data buffer | buffer 0   | buffer 1 | data buffer |
| 23C | data buffer | buffer 0   | buffer 1 | data buffer |
| —   | N/A         | N/A        | null     | ECC buffer 1 |

TABLE 4

| Data scan group # | XOR source 1 | XOR source 2 | XOR destination | Data selector | comment |
|---|---|---|---|---|---|
| 0 | Input Port | all zeroes | buffer 0 | Input Port | SG0 to DB |
| 1 | Input Port | buffer 0 | buffer 1 | Input Port | SG1 to DB |
| 2 | Input Port | buffer 1 | buffer 0 | Input Port | SG2 to DB |
| 3 | Input Port | buffer 0 | buffer 1 | Input Port | SG3 to DB |
| 4 | Input Port | buffer 1 | buffer 0 | Input Port | misread SG4 |
| 5 | Input Port | buffer 1 | buffer 0 | Input Port | output ignored |
| 6 | Input Port | buffer 0 | buffer 1 | Input Port | output ignored |
| 22 | Input Port | buffer 0 | buffer 1 | Input Port | output ignored |
| 23 | Input Port | buffer 1 | buffer 0 | Input Port | output ignored |
| ECC | Input Port | buffer 0 | buffer 1 | Input Port | output ignored |
| N/A | N/A | N/A | null | ECC buffer 1 | SG4 to DB |

Data Record Write to Magnetic Tape

Figure 11:
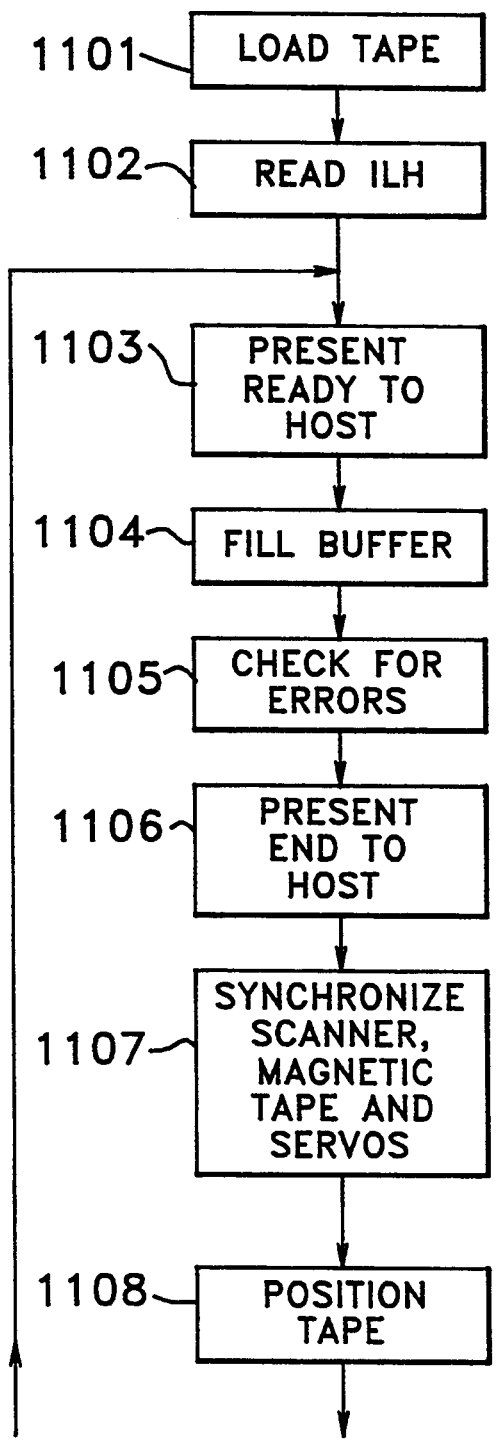
FIGS. 11-13 illustrate in flow diagram form the operational steps taken by the control unit to perform a number of operations on the magnetic tape.
Figure 12:
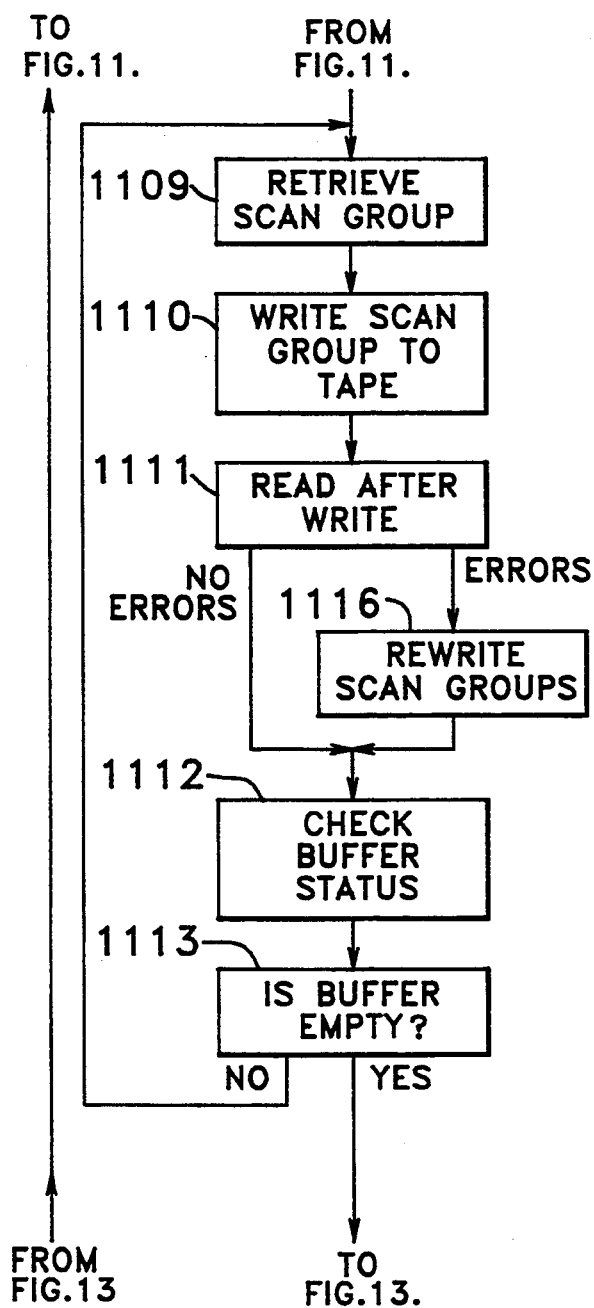
Figure 13:
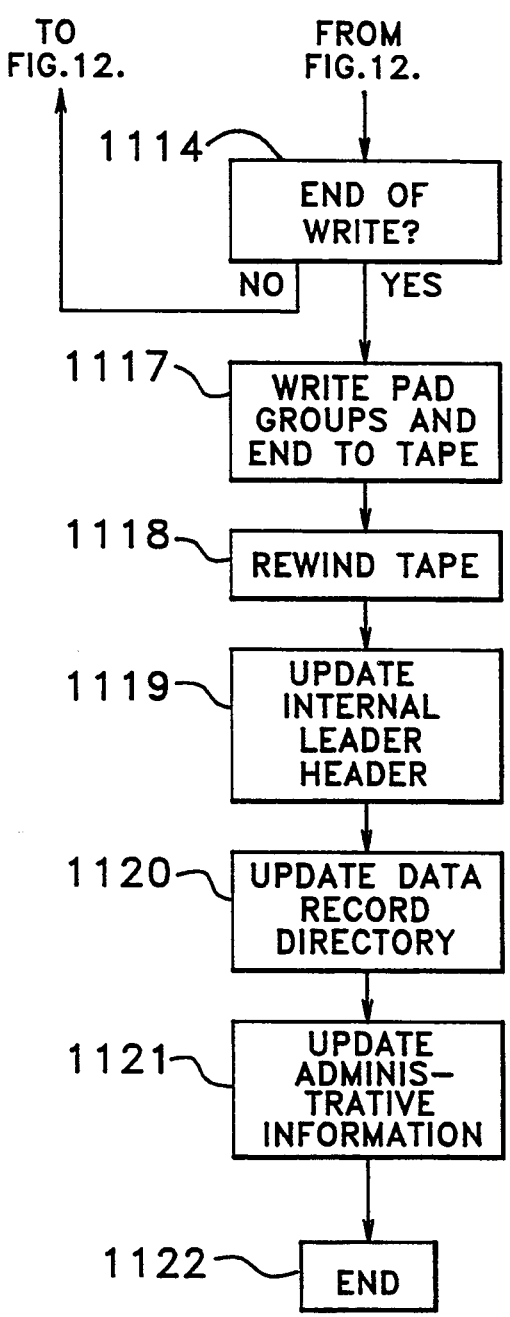

FIGS. 11-13 illustrate in flow diagram form the operational steps taken by tape drive 300 to write data in helical scan form on magnetic tape 100. At step 1101, a magnetic tape cartridge 301 is inserted into tape drive 300 and the tape drive mechanism illustrated in FIG. 3 loads the magnetic tape 100 by threading the leader block 101 and magnetic tape 100 through the tape threading path to the takeup reel 360 which rotates around spindle 361. At step 1102, magnetic tape 100 is advanced forward in order to enable the tape drive control unit 350 to read the internal leader header 105 written on to this magnetic tape 100 via read heads 322 of scanner 320. If this tape is an unused tape, there is no internal leader header 105 on this magnetic tape 100. If the tape has been previously used, the internal leader header 105 contains the information described above and enables tape drive control unit 350 to determine where on magnetic tape 100 the last data record has been written. At step 1103, tape drive control unit 350 presents a ready signal to host computer 1 indicating that tape drive 300 is ready to receive data and commands from host computer 1 via data channel 2. At step 1104, host computer 1 transmits data over data channel 2 that interconnects it to tape drive 300 and the data is written into buffer 802. As the data is written into buffer 802, tape drive control unit 350 checks for errors to make sure there are no transmission errors in the data received from host computer 1. Since tape drive 300 can typically write data to magnetic tape 100 faster than host computer 1 can write the data into buffer 802, tape drive control unit 350 waits at step 1105 for host computer 1 to complete its data transmission and checks for errors. At step 1106 tape drive 300 presents the proper ending status to host computer 1 indicating that the data records have been written or, when buffer 802 is filled to a predetermined level, tape drive 300 begins writing the data to magnetic tape 100 in order to free up more buffer space for host computer 1 to continue writing data records therein. In either case, at step 1107 tape drive control unit 350 ensures that scanner 320, magnetic tape 100 and servos (not shown) are all synchronized. At step 1108, the control unit 350 positions magnetic tape 100 to the physical location on magnetic tape 100 that immediately follows the last written data record. At step 1109, control unit 350 retrieves the appropriate scan group 700 to be written (DID, ILH, SEP, data, ECC, pad, erase gap, end). For the purpose of this description, assume that the scan groups written to magnetic tape 100 represent data records received from host computer 1 and stored in buffer 802. As described above, third level ECC scan groups are periodically written into the stream of data records to form super groups which are written on magnetic tape 100. At step 1110, control unit 350 activates the read/write mechanism described above to write the scan group to magnetic tape 100 and at step 1111, the read after write process leaves scan groups 700 as they are written on to magnetic tape 100 in order to ensure their integrity. If an error is detected in the written scan group, the scan group is rewritten at step 1116 in order to maintain the logical sequence of scan groups on magnetic tape 100. At step 1112, control unit 350 checks the buffer status and at step 1113 determines whether further data is in buffer 802. If data is in buffer 802, steps 1109-1113 are repeated until, at step 1113, no more data is available from buffer 802. Control unit 350 determines at step 1114 whether more data is expected from host computer 1.

At this point (step 1117), control unit 350 writes a plurality (typically three) pad groups and an end group after the last written scan group in order to complete the writing of this stream of data records. At step 1118, magnetic tape 100 is rewound to its beginning and, at step 1119, internal leader header 105 is rewritten with updated information concerning the physical location and identity of the data records that have just been written on to magnetic tape 100 being input to internal leader header 105 at step 1120 into data, record directory 502. At step 1121, control unit 350 writes updated information into the administrative information section 501 of internal leader header 105. This information is described above and entails elements 2601-2608 and 2101-2108 being sequentially activated and their outputs multiplexed by multiplexor 2201 into buffer 802 to form a scan group for internal leader header 105. The elements disclosed in FIG. 22 can be registers in control unit 350, software routines that execute in control unit 350, memory entries in the memory (not shown) that is part of control unit 350, etc. Suffice it to say that the nature of the data created by each of elements 2601-2608, 2101-2108 determines the implementation of the corresponding element. Multiplexor 2201 represents the element in control unit 350 that formats all the data created by elements 2601-2608, 2101-2108 into the formats illustrated in FIGS. 6 and 10. Again, it is expected that multiplexor 2201 may be a software element within control unit 350 that formats the data created by elements 2601-2608, 2101-2108 into data record directory 502 and administrative information 501 sections of internal leader header. Thus, on an initial load of magnetic tape 100, the internal leader header 105 is read and the data contained therein is read into elements 2601-2608, 2101-2108 as illustrated by the inputs on the left side of FIG. 22 to each of the elements 2601-2608, 2101-2108. During the use of magnetic tape 100, many of these data entries are updated, supplemental and/or modified until control unit 350 rewrites internal leader header 105, at which time the data contained in and generated by elements 2601-2608, 2101-2108 is used to populate internal leader header 105. At step 1122, the tape write operation is completed and magnetic tape 100 can be unloaded or positioned ready for subsequent data record writes. If, at step 1114, control unit 350 determines that further data is expected from host computer 1, control unit 350 at step 1115 writes a plurality of pad scan groups to the end of the last written data scan group and rewinds magnetic tape 100 to the end of the first of these pad scan groups. Control unit 350 then returns to step 1103 and presents a ready status to host computer 1.

Figure 18:
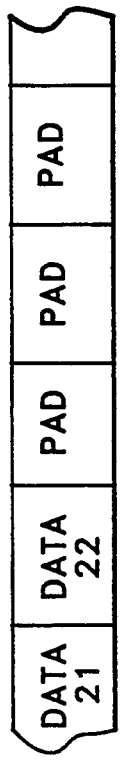

FIG. 17 illustrates in block diagram form the sequence of scan group writing on magnetic tape 100. A typical situation that is encountered is that buffer 802 runs out of full scan groups and more data is expected to be received from host computer 1. For example, buffer 802 runs out of data at the end of scan group 22 and control unit 350 therefore writes a plurality (3) pad scan groups so that a readback check of the data can be completed. The control unit 350 does not write a third level ECC scan group on to magnetic tape 100 since more data groups are expected to be written to fill out the super group scan group count to twenty-five. Once the third pad scan group has been written, the tape drive mechanism decelerates magnetic tape 100 and repositions magnetic tape 100 to the end of the first pad scan group written after data scan group 22. This is done in order to maintain a pad scan group as a safety zone between the last written data scan group 22 and the next subsequently received data scan group. This is to prevent the flying erase head 323 from erasing any of the data contained in data scan group 22. Once subsequent data is received, data beginning with data scan group 23 is written on to magnetic tape 100 and the two pad scan groups previously written on to magnetic tape 100 are erased by the flying erase head 323 and overwritten with data. As can be seen from FIG. 17, the third level ECC scan group is written following data scan group 24 and subsequently received data is written as data scan groups 1 and 2. If buffer 802 again is empty and more scan groups are expected to be received from host computer 1, three pad scan groups are appended to the end of data scan group 2 in anticipation of repeating the cycle data write described above. If no further writes are anticipated, as shown in FIG. 18 a third level ECC group is written at the end of the data scan group 2 and three pad scan groups are written following the ECC group. An end group is then written to indicate the last valid data that was written to the magnetic tape. Any old data written on magnetic tape 100 beyond this point is considered as not valid and subject to overwriting by subsequently received data.

Write Skips

Figure 19:
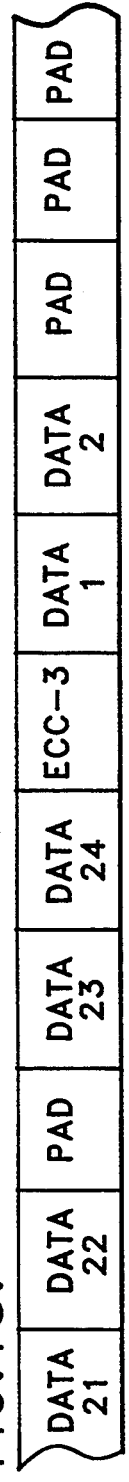
Figure 20:
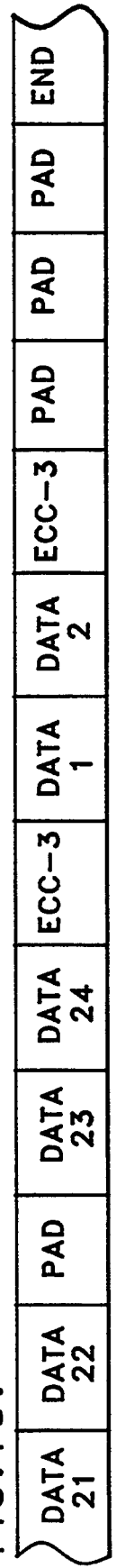

As noted above, the tape drive control unit 350 performs readback checks as the data is being written on to magnetic tape 100. When the readback check indicates that a scan group has not been written satisfactorily it is written again further down magnetic tape 100 without rewriting anything in the original scan group. This is illustrated in block diagram form in FIG. 19. If the first instance of scan group 2 is not written properly, this is detected during the readback check process. However, since the readback check process occurs physically downstream from write head 321, scan groups 3 and most of scan group 4 are written on to magnetic tape 100 before the error in scan group 2 is detected. Therefore, scan groups 2, 3 and 4 must be rewritten in order to maintain serial continuity of the scan groups on magnetic tape 100. Thus, scan group 2 is rewritten as scan group 2a, scan groups 3 and 4 are rewritten as scan groups 3a and 4a respectively. This maintains a logical sequence of records on magnetic tape 100 and the tape drive 300, during a read process, reads scan group 1 and then skips to scan groups 2a, 3a, 4a to maintain the logical sequence of data records on magnetic tape 100. If the readback check of scan group 2a is not acceptable, scan groups 2, 3 and 4 are rewritten again as scan groups 2b, 3b, 4b. If the readback check of scan group 2b is acceptable, the logical sequence of data records after 4b continues with scan group 5, 6, etc. The scan group header of each of these scan groups includes a copy count in order that tape drive 300 can determine which scan group is valid for read purposes. Scan groups 2–4, and 2a–4a are not used for computing third level ECC nor are read during the read process. A similar process occurs when host computer 1 reads to the middle of a scan group and then rewrites data from that point on. The original scan group is left on magnetic tape 100 and a new scan group is appended, where the new scan group contains a combination of valid old data and new data. This allows all new host data to have CRC checks and the scan group header for the new scan groups indicates that it is a rewrite of an old scan group. By not overwriting the old scan group, its data can be recovered if the new scan group can not be written. A pad scan group is interposed between the old and new scan groups as a safety zone to help protect the integrity of the old scan group when writing new data on magnetic tape 100.

While a specific embodiment of this invention has been disclosed, it is expected that those skilled in the art can and will design alternate embodiments of this invention that fall within the scope of the appended claims.

We claim:

1. In a drive element which reads and writes a stream of data records, received from an associated host computer, on a magnetic tape in a helical scan format, which includes a plurality of tracks helically written on said magnetic tape for storing said stream of data records, apparatus operationally independent of said host computer for writing error correction data on said magnetic tape to protect said stream of data records, comprising:
   means for generating a first error correcting code specific to a plurality of bytes of said stream of data records, comprising:
      means for storing said stream of data records in a memory on a column by column basis,
      means for computing a first error correction code on a column by column basis for said stream of data records stored in said memory,
      means for appending said generated first error correction code to said memory on a column by column basis;
   means for dividing said received stream of data records and said first error correcting codes into a series of data segments, each data segment containing a predetermined number of bytes;
   means for reading said data segments on a row by row basis from said memory;
   means for generating a second error correcting code specific to each of said data segments;

means for concatenating a plurality of said data segments and their associated generated second error correcting codes to form a helical track of data;

means for writing a plurality of said helical tracks of data on to said magnetic tape to form a scan group;

means for computing a third error correcting code across a plurality of said scan groups sequentially written on to said magnetic tape; and means for writing said third error correcting code on to said magnetic tape.

2. The apparatus of claim 1 wherein said writing means writes said third error correction code on to said magnetic tape immediately following a last of said plurality of scan groups across which said third error correction code is generated.

3. The apparatus of claim 1 wherein said computing means includes:

means for Exclusive ORing said plurality of scan groups to form a parity scan group.

4. The apparatus of claim 3 wherein at least one track of each of said scan groups includes rewriteable header information containing scan group administrative data, said Exclusive ORing means operates on said plurality of scan groups exclusive of said rewriteable header information in said plurality of scan groups.

5. The apparatus of claim 1 wherein said second error correction code generating means includes:

means for computing a Reed Solomon code across said data segment.

6. In a drive element which reads and writes a stream of data records, received from an associated host computer, on a magnetic tape in a helical scan format, which includes a plurality of tracks helically written on said magnetic tape for storing said stream of data records, a method that is operationally independent of said host computer for writing error correction data on said magnetic tape to protect said stream of data records, comprising the steps of:

generating a first error correcting code specific to a plurality of bytes of said stream of data records, comprising:

storing said stream of data records in a memory on a column by column basis, computing a first error correction code on a column by column basis for said stream of data records stored in said memory, appending said generated first error correction code to said memory on a column by column basis;

dividing said received stream of data records and said first error correcting codes into a series of data segments, each data segment containing a predetermined number of bytes;

reading said data segments on a row by row basis from said memory;

generating a second error correcting code specific to each of said data segments;

concatenating a plurality of said data segments and their associated generated second error correcting codes to form a helical track of data; p2 writing a plurality of said helical tracks of data on to said magnetic tape to form a scan group;

computing a third error correcting code across a plurality of said scan groups sequentially written on to said magnetic tape; and writing said third error correcting code on to said magnetic tape.

7. The method of claim 6 wherein said step of writing writes said third error correction code on to said magnetic tape immediately following a last of said plurality of scan groups across which said third error correction code is generated.

8. The method of claim 6 wherein said step of computing includes:

Exclusive ORing said plurality of scan groups to form a parity scan group.

9. The method of claim 8 wherein at least one track of each or said scan groups includes rewriteable header information containing scan group administrative data, said step of Exclusive ORing operates on said plurality of scan groups exclusive of said rewriteable header information in said plurality of scan groups.

10. The method of claim 6 wherein said step of generating said second error correction code includes:

computing a Reed Solomon code across said data segment.

11. In a drive element which reads and writes a stream of data records, received from an associated host computer, on a magnetic tape in a helical scan format, which includes a plurality of tracks helically written on said magnetic tape for storing said stream of data records, apparatus operationally independent of said host computer for writing error correction data on said magnetic tape to protect said stream of data records, comprising:

means for generating a first error correcting code specific to a plurality of bytes of said stream of data records comprising:

means for storing said stream of date records in a memory on a column by column basis.

means for computing a first error correction code on a column by column basis for said stream of data records stored in said memory, means for appending said generated first error correction code to said memory on a column by column basis;

means for dividing said received stream of data records and said first error correcting codes into a series of data segments, each data segment containing a predetermined number of bytes;

means for reading said data segments on a row by row basis form said memory;

means for generating a second error correcting code specific to each of said data segments;

means for concatenating n sequential ones of said series of data segments and their associated generated second error correcting codes to form a helical track of data;

means for writing m sequentially formed helical tracks of data on to said magnetic tape to form a scan group, where m is a positive integer greater than 1;

means for computing a third error correcting code across s said scan groups sequentially written on to said magnetic tape, where s is a positive integer greater than 1; and means for writing said third error correcting code on to said magnetic tape in helical scan format.

12. The apparatus of claim 11 further comprising:

means for dynamically assigning a value to the number s of scan groups operated on by said computing means.

13. The apparatus of claim 12 wherein said dynamically assigning means includes:

means, responsive to said host computer terminating said stream of data records, for selecting a value of s to include a last one of said terminated stream of data records in said generated third error correction code.

14. The apparatus of claim 11 wherein said computing means includes:

means for Exclusive ORing said plurality of scan groups to form a parity scan group.

15. The apparatus of claim 14 wherein said writing means writes said parity scan group on to said magnetic tape immediately following a last of said plurality of scan groups Exclusive ORed to form said parity scan group.

16. The apparatus of claim 14 wherein at least one track of each of said scan groups includes rewriteable header information containing scan group administrative data, said Exclusive ORing means operates on said plurality of scan groups exclusive of said rewriteable header information in said plurality of scan groups.

17. The apparatus of claim 11 wherein said second error correction code generating means includes:

means for computing a Reed Solomon code across said data segment.

18. The apparatus of claim 11 wherein said concatenating means includes:

means for prepending a header to each of said data segments; and means for appending said generated second error correction code to said specific data segment.

19. In a drive element which reads and writes a stream of data records, received from an associated host computer, on a magnetic tape in a helical scan format, which includes a plurality of tracks helically written on said magnetic tape for storing said stream of data records, a method that is operationally independent of said host computer for writing error correction data on said magnetic tape to protect said stream of data records, comprising the steps of:

generating a first error correcting code specific to a plurality of bytes of said stream of data records, comprising:

storing said stream of data records in a memory on a column by column basis, computing a first error correction code on a column by column basis for said stream of data records stored in said memory, appending said generated first error correction code to said memory on a column by column basis;

dividing said received stream of data records and said first error correcting codes into a series of data segments, each data segment containing a predetermined number of bytes;

reading said data segments on a row by row basis from said memory;

generating a second error correcting code specific to each of said data segments;

concatenating n sequential ones of said series of data segments and their associated generated second error correcting codes to form a helical track of data, where n is a positive integer greater than 1;

writing m sequentially formed helical tracks of data on to said magnetic tape to form a scan group, where m is a positive integer greater than 1;

computing a third error correcting code across s said scan groups sequentially written on to said magnetic tape, where s is a positive integer greater than 1; and writing said third error correcting code on to said magnetic tape in helical scan format.

20. The method of claim 19 further comprising:

the step of dynamically assigning a value to the number s of scan groups operated on by said step of computing.

21. The method of claim 20 wherein said step of dynamically assigning includes:

selecting, in response to said host computer terminating said stream of data records, a value of s to include a last one of said terminated stream of data records in said generated third error correction code.

22. The method of claim 19 wherein said step of computing includes:

Exclusive ORing said plurality of scan groups to form a parity scan group.

23. The method of claim 22 wherein said step of writing writes said parity scan group on to said magnetic tape immediately following a last of said plurality of scan groups Exclusive ORed to form said parity scan group.

24. The method of claim 22 wherein at least one track of each of said scan groups includes rewriteable header information containing scan group administrative data, said step of Exclusive ORing operates on said plurality of scan groups exclusive of said rewriteable header information in said plurality of scan groups.

25. The method of claim 19 wherein said step of second error correction code generating includes:

computing a Reed Solomon code across said data segment.

26. The method of claim 19 wherein said step of concatenating includes:

prepending a header to each of said data segments; and appending said generated second error correction code to said specific data segment.

27. In a drive element which reads and writes a stream of data records, received from an associated host computer, on a magnetic tape in a helical scan format, which includes a plurality of tracks helically written on said magnetic tape for storing said stream of data records, apparatus operationally independent of said host computer for writing error correction data on said magnetic tape to protect said stream of data records, comprising:

means for storing said received stream of data records in a memory in a first direction;

means for generating a first error correction code orthogonally across said data records stored in said memory:

means for dividing said data records and said first error correction codes stored in said memory in a second direction orthogonal to said first direction into a series of data segments, each data segment containing a predetermined number of bytes;

means for generating a second error correcting code specific to each of said data segments;

means for concatenating a plurality of said data segments and their associated generated second error correcting codes to form a helical track of data;

means for writing a plurality of said helical tracks of data on to said magnetic tape to form a scan group;

means for computing a multiple scan group error correcting code across a plurality of said scan groups sequentially written on to said magnetic tape; and means for writing said multiple scan group error correcting codes on to said magnetic tape.

28. In a drive element which reads and writes a stream of data records, received from an associated host computer, on a magnetic tape in a helical scan format, which includes a plurality of tracks helically written on said magnetic tape for storing said stream of data records, a method that is operationally independent of said host computer for writing error correction data on said magnetic tape to protect said stream of data records, comprising the steps of:

storing said received stream of data records in a memory in a first direction:

generating a first error correcting code orthogonally across said data records stored in said memory:

dividing said data records and said first error correcting codes stored in said memory into a series of data segments, each data segment containing a predetermined number of bytes;

generating a second error correcting code specific to each of said data segments;

concatenating a plurality of said data segments and their associated generated second error correcting codes to form a helical track of data;

writing a plurality of said helical tracks of data on to said magnetic tape to form a scan group;

generating at least one scan group error correcting code specific to each said scan group;

computing a multiple scan group error correcting code across a plurality of said scan groups sequentially written on to said magnetic tape; and writing said scan group and said multiple scan group error correcting codes on to said magnetic tape.

* * * * *